United States Patent [19]
Yoshino

[11] Patent Number: 5,386,138
[45] Date of Patent: Jan. 31, 1995

[54] SEMICONDUCTOR DEVICE WITH DIODES CONNECTED IN SERIES

[75] Inventor: Isao Yoshino, Tokyo, Japan
[73] Assignee: NEC Corporation, Tokyo, Japan
[21] Appl. No.: 253,865
[22] Filed: Jun. 3, 1994
[30] Foreign Application Priority Data
  Jun. 10, 1993 [JP] Japan .................. 5-165239
[51] Int. Cl.6 ............................................. H01L 29/90
[52] U.S. Cl. .................. 257/551; 257/106; 257/481; 257/603; 257/605
[58] Field of Search ............. 257/106, 481, 551, 603, 257/605

[56] References Cited
U.S. PATENT DOCUMENTS
  4,948,989 8/1990 Spratt ................... 257/603
FOREIGN PATENT DOCUMENTS
  4-215468 8/1992 Japan .

Primary Examiner—Edward Wojciechowicz
Attorney, Agent, or Firm—Young & Thompson

[57] ABSTRACT

A semiconductor device including first and second diodes which are provided on the same side of a semiconductor substrate of a first conductivity type and which are connected in series with each other through the substrate. A main surface of the substrate is covered with an insulator film having first and second windows. A first patterned conductive film of a second conductivity type is in contact with the main surface of the substrate through the first window. The first conductive film and the substrate forme a p-n junction of a first diode at their interface. A second patterned conductive film is formed on the first conductive film acting as one of electrodes of the semiconductor device. A first conductive region of the second conductivity type is formed in a surface area of the substrate adjacent to the main surface. The first conductive region and the substrate form a p-n junction of a second diode at their interface. A third patterned conductive film acting as the other of the electrodes is in contact with the first conductive region through the second window. The die bonding and wire bonding methods are available and various types of packages be applied for the device.

6 Claims, 3 Drawing Sheets

SEMICONDUCTOR DEVICE WITH DIODES CONNECTED IN SERIES

BACKGROUND OF THE INVENTION

1. Field of the Invention

The present invention relates to a semiconductor device and more particularly, to a semiconductor device equipped with diodes connected in series such as that having a reference voltage generating diode and a temperature-compensating diode therefor, which is used for a reference voltage generator in measurement systems or the like.

2. Description of the Prior Art

FIG. 1 shows an example of conventional semiconductor devices of this sort. In FIG. 1, a Zener diode ZD is provided on a first main surface of an n-type silicon substrate 11 to generate a reference voltage, and a temperature-compensating diode Di is provided on second main surface of the substrate 11 to compensate the temperature characteristic of the Zener diode ZD. The diodes ZD and Di are connected in series with each other through the substrate 11.

A silicon dioxide film 12a having a window is formed on the first main surface of the substrate 11. A p-type diffusion region 14 is formed in the substrate 11 along the periphery of the window to act as a guard ring for the Zener diode ZD. The circular ringed diffusion region 14 is deposited in the surface area of the substrate 11 adjacent to the first main surface.

A p-type patterned polysilicon film 15 as an anode is formed on the exposed part of the substrate 11 to be in contact with its first main surface through the window of the silicon dioxide film 12a. The n-type silicon substrate 11 and the p-type polysilicon film 12a form a main p-n junction of the Zener diode ZD at their contact area surrounded by the guard ring 14. The fringe of the polysilicon film 15 is deposited on the silicon dioxide film 12a.

A silver (Ag) bump 17a as a first electrode is formed on the polysilicon film or anode 15.

A silicon dioxide film 12b having a window is formed on the second main surface of the substrate 11, which is opposite to the first main surface. A p-type diffusion region 13 as an anode is formed in the substrate 11. The region 13 is deposited in the surface area of the substrate 11 adjacent to the second main surface and in the position opposite to the p-type diffusion region 14. The p-type diffusion region 13 and the n-type substrate 11 form a p-n junction of the temperature-compensating diode Di at their contact area.

A silver bump 17b as a second electrode is formed on the exposed part of the substrate 11 to be in contact with the diffusion region 13 through the window of the silicon dioxide film 12b. The fringe of the silver bump 17b is deposited on the silicon dioxide film 12b.

The substrate 11 acts as cathodes of the diodes ZD and Di, which are coupled together.

The conventional semiconductor device as described above is fabricated through the following process sequence.

First, the silicon dioxide films 12a and 12b are formed on the first and second main surfaces of the n-type silicon substrate 11, and the windows are formed in the films 12a and 12b, respectively, as shown in FIG. 1.

Next, a p-type impurity is selectively diffused through the windows into the substrate 11 to form the p-type diffusion region 14 as the guard ring of the Zener diode ZD and the p-type diffusion region 13 as the anode of the temperature-compensating diode Di, respectively.

Then, the p-type patterned polysilicon film 15 as the anode is formed on the exposed part of the substrate 11 to form the main p-n unction of the Zener diode ZD.

Finally, the silver bump 17a as the first electrode is formed on the p-type polysilicon film 15 and the silver bump 17b as the second electrode is formed on the p-type diffusion region 13. Thus, the conventional semiconductor device shown in FIG. 1 is finished.

With the above-mentioned conventional semiconductor device shown in FIG. 1, the Zener diode ZD and the temperature-compensating diode Di are formed at each side of the substrate 11, in other words, the semiconductor device is of the double-sided structure. Therefore, the Double Heatsink Diode (DHD)-type package has been applied for the device.

There is a problem that the conventional semiconductor device cannot be packaged using the die bonding (or pellet mounting) method and the wire bonding method, which means that the plastic-molded package and the can and ceramic casings do not available for the device. Also, since only the DHD-type package is available, the device cannot be made as a surface-mount device.

There is another problem that the electrical characteristics of the conventional semiconductor device are difficult to be tested in the state of the wafer because of its double-sided structure.

There is still another problem that one of the diodes ZD and Di must be protected in the dicing process because of its double-sided structure, which makes the dicing process complicated.

SUMMARY OF THE INVENTION

Accordingly, an object of the present invention is to provide a semiconductor device having first and second diodes connected in series, for which the die bonding and wire bonding methods are available and as a result, various types of packages can be applied for the device.

Another object of the present invention is to provide a semiconductor device having first and second diodes connected in series, which can be made as a surface-mount device.

Still another object of the present invention is to provide a semiconductor device having first and second diodes connected in series, which is easy to be tested in the wafer state and its fabrication process sequence can be made simpler and more efficient than the conventional one.

A semiconductor device according to the present invention includes a semiconductor substrate of a first conductivity type, a main surface of which is covered with an insulator film having first and second windows. A first patterned conductive film of a second conductivity type is in contact with the main surface of the substrate through the first window. The first conductive film and the substrate form a p-n junction of a first diode at their interface. A second patterned conductive film acting as one of electrodes of said semiconductor device is formed on the first conductive film.

A first conductive region of the second conductivity type is formed in a surface area of the substrate adjacent to the main surface. The first conductive region and the substrate form a p-n junction of a second diode at their interface. A third patterned conductive film as the other of the electrodes is in contact with the first conductive region through the second window of the insulator film.

The first and second diodes are connected in series through the substrate.

Any type of diodes may be used for the first and second diodes, respectively. Preferably, the first diode is a Zener diode and the second diode is a p-n junction diode for temperature-compensating the first diode.

With the semiconductor device according to the present invention, the first and second diodes are provided on the same side of the semiconductor substrate and the second and third patterned conductive films acting as the respective electrodes of the semiconductor device are provided on the same side as the first and second diodes, so that the die bonding and wire bonding methods are available for packaging the device, different from the conventional semiconductor device.

As a result, various types of packages such as a plastic package and a ceramic package can be applied for the device, and the device can be made as a surface-mount device or part.

Also, since no diode is provided at the opposite side of the substrate, no diode protection is needed in the dicing process. Therefore, the device is easy to be tested in the state of the wafer and its fabrication process sequence including the dicing process can be made simpler and more efficient than the conventional one.

DESCRIPTION OF THE PREFERRED EMBODIMENTS

Figure 1:
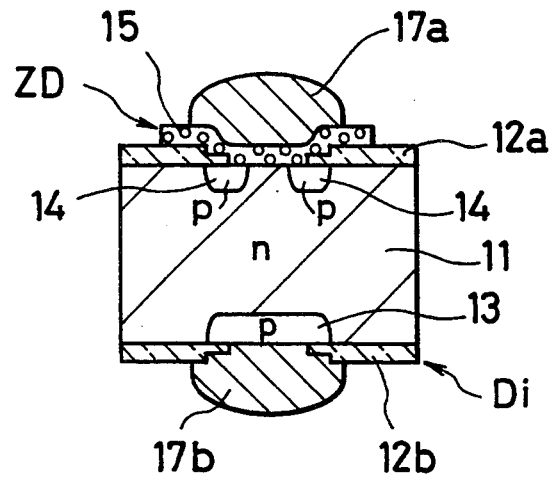
FIG. 1 is a cross-sectional view of a conventional semiconductor device.

Preferred embodiments of the present invention will be described bellow while referring to the drawings attached.

Figure 2A:
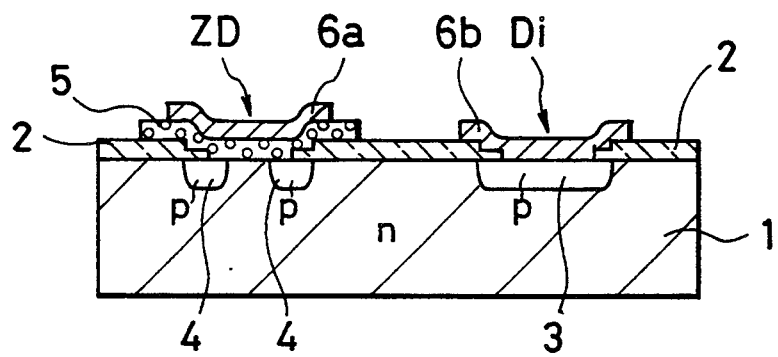
FIG. 2A is a cross-sectional view of a semiconductor device according to an embodiment of the present invention.

In FIG. 2A, a semiconductor device of an embodiment of the present invention has a Zener diode ZD for generating a reference voltage and a temperature-compensating diode Di for compensating the temperature characteristic of the Zener diode ZD. Different from the conventional semiconductor device as shown in FIG. 1, the Zener diode ZD as a first diode and the temperature-compensating diode Di as a second diode are formed on the same side of an n-type single-crystal silicon substrate 1.

On a main surface of the substrate 1, there is formed a silicon dioxide film 2 having first and second circular windows. A p-type patterned polysilicon film 5 is formed on an exposed part of the substrate 1 and is in contact with the main surface of the substrate 1 through the first window of the film 2. The fringe of the polysilicon film 5 is deposited on the silicon dioxide film 2. The n-type silicon substrate 1 and the p-type polysilicon film 2 form a main p-n junction of the Zener diode ZD at their contact area.

A p-type diffusion region 4 is formed in the substrate 1 along the periphery of the first window to act as a guard ring for the Zener diode ZD. The diffusion region 4 is deposited in an surface area of the substrate 1 adjacent to the main surface and surrounding the main p-n junction of the diode ZD.

A patterned aluminum (Al) film 6a acting as one of electrodes of the semiconductor device is formed on the polysilicon film 5.

A p-type diffusion region 3 is formed in the surface area of the substrate 1 adjacent to the same main surface and is arranged at a position right below the second window of the silicon dioxide film 2. The p-type diffusion region 3 and the n-type substrate 1 form a p-n junction of the temperature-compensating diode Di at their contact area.

A patterned aluminum film 6b acting as the other of the electrodes of the semiconductor device is formed on an exposed part of the substrate 1 and is in contact with the diffusion region 3 through the second window of the silicon dioxide film 2. The fringe of the aluminum film 6b is deposited on the silicon dioxide film 2.

Figure 4:
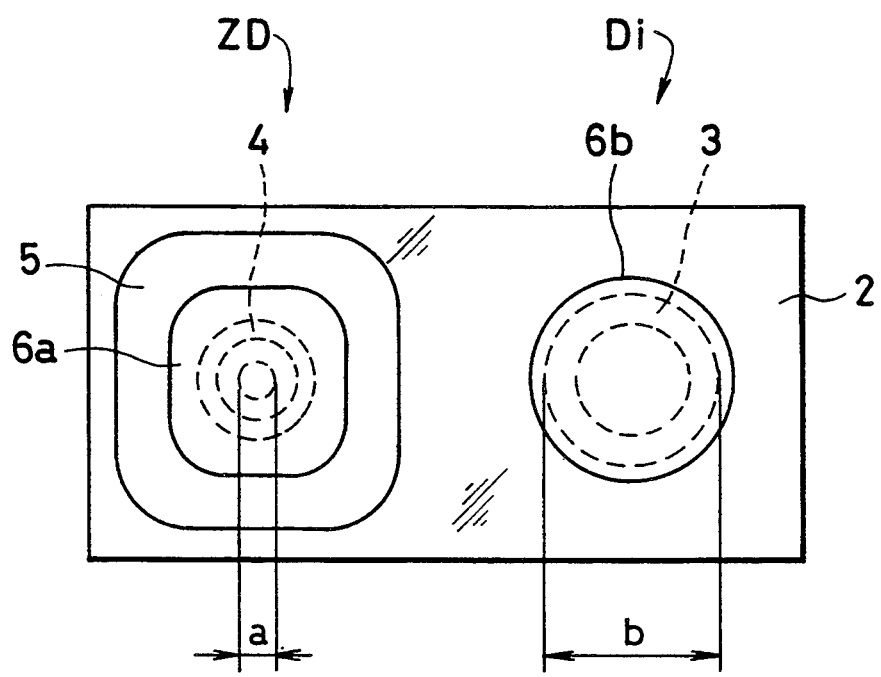
FIG. 4 is a top view of the semiconductor device according to the embodiment.

FIG. 4 shows the plan view of the semiconductor device shown in FIG. 2A. The p-type polysilicon film 5 and the aluminum film 6a are of approximately square shapes with round corners, respectively. The p-type diffusion region 4 is of a circular ring shape. The p-type diffusion region 3 and the aluminum film 6b are of circular shapes, respectively.

The main p-n junction of the Zener diode ZD is of a circular shape whose diameter is a and that of the temperature-compensating diode Di is of a circular shape whose diameter is b. Here, the diameters a and b are 50 $\mu$m and 230 $\mu$m, respectively.

Figure 2B:
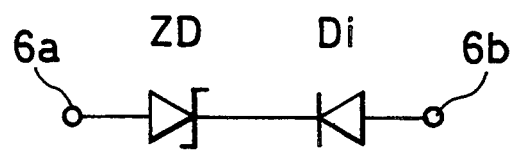
FIG. 2B is an equivalent circuit diagram of the semiconductor device according to the embodiment.

The equivalent circuit of the semiconductor device is shown FIG. 2B. It is seen from FIG. 2B that the diodes ZD and Di are connected in series so that their cathodes are coupled within each other. Anodes of the diodes ZD and Di are connected to the patterned aluminum films or electrodes 6a and 6b of the device, respectively.

The semiconductor device as described above is fabricated through the following process sequence.

Figure 3A:
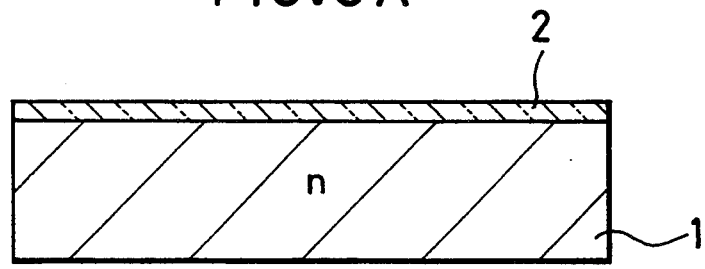
FIGS. 3A, 3B and 3C are cross-sectional views showing a fabrication process sequence of the semiconductor device according to the embodiment, respectively.

First, as shown in FIG. 3A, the silicon dioxide film 2 is formed on the main surface of the n-type silicon substrate 1 having a resistivity of 0.01 $\Omega$·cm by a thermal oxidation method.

Figure 3B:
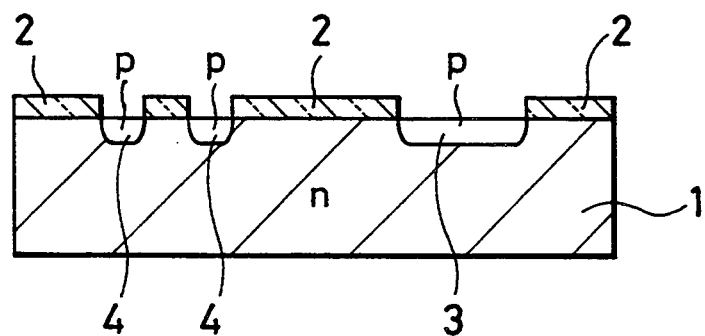

Next, the silicon dioxide film 2 is patterned to form first and second openings therein, as shown in FIG. 3B. The first opening for the Zener diode ZD is circular ringed and the second opening for the temperature-compensating diode Di is circular.

Boron (B) is doped into the substrate 1 through the first and second openings by a thermal diffusion method. Thus, the circular ringed p-type diffusion region 4 as the guard ring and the circular p-type diffusion region 3 are formed in the surface area of the substrate 1 adjacent to the main surface. Thus, both of the regions 3 and 4 are formed in the same process step.

The impurity concentrations of the p-type diffusion regions 3 and 4 are set to be about $8 \times 10^{19}$ cm$^{-3}$ and as a result, the withstand voltage of the guard ring of the Zener diode ZD becomes to be about 8 V.

To dope Boron as a p-type impurity into the substrate in an ion-implantation method may be used instead of the thermal diffusion method.

Figure 3C:
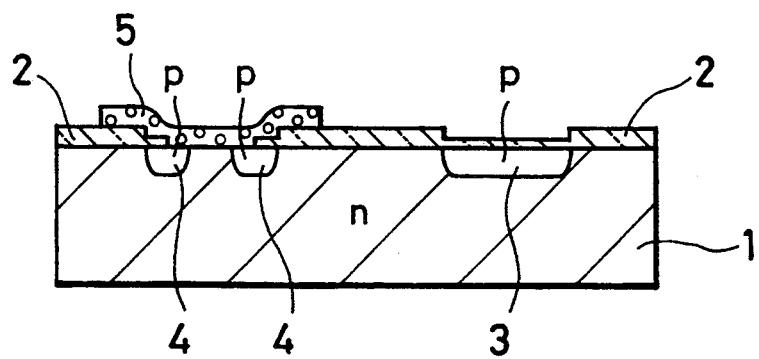

Subsequently, the remaining portion of the film 2 at the center of the first opening is removed and a silicon dioxide film is formed and patterned to cover the portion of the substrate 1 which is exposed through the second opening of the silicon dioxide film 2, as shown in FIG. 3C.

Then, a polysilicon film (not shown) is grown on the silicon dioxide film 2 while doping Boron thereinto and patterned to form the p-type patterned polysilicon film 5, as shown in FIG. 3C. Thus, the main p-n junction of the Zener diode ZD is obtained in the contact area or interface of the polysilicon film 5 and the substrate 1.

During this process step, the backward or reverse withstand voltage of the Zener diode ZD is set to be about 5.5 V where the electrical characteristics of the diode ZD are stable and temperature compensation on the diode ZD by the temperature-compensating diode Di can be easily carried out.

To form the p-type patterned polysilicon film 5, boron may be doped by an ion-implantation method into an non-doped or i-type polysilicon film formed on the silicon dioxide film 2.

Finally, after the part of the silicon dioxide film 2 left on the p-type diffusion region 3, an Aluminum film (not shown) is formed and patterned to form the electrodes 6a and 6b on the p-type polysilicon film 5 and the p-type diffusion region 3 by an evaporation method, respectively.

Thus, the semiconductor device as shown in FIGS. 2A and 4 is obtained.

In general, the temperature coefficient ($dV_F/dT$) of the forward voltage drop $V_F$ of the temperature-compensating diode Di is expressed as $$\frac{dV_F}{dT} = a + b \log j \quad (1)$$

where T is absolute temperature, a is the diameter of the main p-n junction of the Zener diode ZD, b is the diameter of the p-n junction of the temperature-compensating diode Di, and j is the current density of the semiconductor device.

The temperature coefficient ($dV_Z/dT$) of the Zener voltage $V_Z$ of the Zener diode ZD is expressed as $$\frac{dV_Z}{dT} = aV_Z + b \quad (2)$$

It is seen from the equations (1) and (2) that the following equation (3) needs to be satisfied to obtain a stable reference voltage independent on the ambient temperature.

$$\frac{dV_F}{dT} \approx \frac{dV_Z}{dT} \quad (3)$$

In the embodiment, as already described above, the main p-n junction of the Zener diode ZD has the diameter a of 50 μm and the p-n junction of the temperature-compensating diode Di has the diameter b of 230 μm. Such diameters are determined based on the following:

When $j=0.02$ A/mm$^2$, which means that the supplied current of the semiconductor device is 1 mA because of the diameter b of 230 μm, the temperature coefficient ($dV_F/dT$) of the forward voltage drop $V_F$ of the temperature-compensating diode Di was about 1.6 mV/°C. Then, to make the temperature coefficient ($dV_Z/dT$) of the Zener voltage $V_Z$ of the Zener diode ZD equal to the temperature coefficient ($dV_F/dT$), or to satisfy the following relationship as $$\frac{dV_Z}{dT} = aV_Z + b \approx 1.6 \text{ mV/°C}.$$

the inventor made some experiments. As a result, the optimum value of the main p-n junction diameter a of the Zener Diode ZD was found to be about 50 μm.

In the case, when the supplied current of the semiconductor device is 1 mA, a stable reference voltage of 5.5 V was obtained between the electrodes 6a and 6b.

Additionally, in the embodiment, the main p-n junction of the Zener diode ZD is surrounded by the guard ring of the p-type diffusion region 4, so that there is an advantage of high reliability.

Since both of the diodes ZD and Di are formed on the same side of the substrate 1 and the electrodes respectively made of the patterned Aluminum films 6a and 6b are provided on the same side as the diodes ZD and Di, the die bonding and wire bonding methods are available for packaging the semiconductor device. As a result, various types of packages can be applied therefor. For example, the device can be packaged in a mini plastic-molded package to provide it as a surface-mount device or part.

Also, since both of the diodes ZD and Di are formed on the same side of the substrate 1, the device is easy to be tested prior to dividing the wafer to chips, which means that the number of its testing steps can be reduced and the result of the testing steps can be fedback to the fabrication line promptly.

Further, the dicing process can be carried out in the same way as the popular p-n junction diodes, so that the fabrication process sequence of the device can be made simpler and more efficient than the prior art.

In the above embodiment, the n-type silicon substrate 1 is used, however, it is needles to say that a p-type silicon substrate may be used, in which n-type diffusion regions are formed instead of the p-type diffusion regions 3 and 4, respectively and an n-type conductive film is provided instead of the p-type polysilicon film 5.

Any semiconductor materials may be used as the substrate 1 and film 5. Any metallic materials may be used as the electrodes 6a and 6b.

While the preferred form of the present invention has been described, it is to be understood that modifications will be apparent to those skilled in the art without departing from the spirit of the invention. The scope of the invention, therefore, is to be determined solely by the following claims.

What is claimed is:

1. A semiconductor device comprising:
   a semiconductor substrate of a first conductivity type;
   an insulator film covering a main surface of said substrate, said insulator film having a first window and a second window;
   a first patterned conductive film of a second conductivity type, said first conductive film being in contact with said main surface of said substrate through said first window of said insulator film;
   said first conductive film and said substrate forming a p-n junction of a first diode at their interface;
   a second patterned conductive film acting as one of electrodes of said semiconductor device, said second conductive film being formed on said first conductive film;
   a first conductive region of said second conductivity type, said first conductive region being formed in a surface area of said substrate adjacent to said main surface;

said first conductive region and said substrate forming a p-n junction of a second diode at their interface; and a third patterned conductive film acting as the other of said electrodes of said semiconductor device, said third conductive film being in contact with said first conductive region through said second window of said insulator film;

wherein said first diode and said second diode are connected in series through said substrate.

2. A semiconductor device as claimed in claim 1, wherein said first diode is a Zener diode for generating a reference voltage between said electrodes of said semiconductor device, and said second diode is a temperature-compensating diode for compensating the temperature characteristic of said first diode.

3. A semiconductor device as claimed in claim 2, wherein said p-n junctions of said first and second diodes have sizes so that a temperature coefficient of a forward voltage drop of said temperature-compensating diode substantially compensates that of a Zener voltage of said Zener diode.

4. A semiconductor device as claimed in claim 2, wherein said first patterned conductive film is made of polysilicon, and said second and third patterned conductive films are made of Aluminum, respectively.

5. A semiconductor device as claimed in claim 2, further comprising a second conductive region of said second conductivity type, wherein said second conductive region is formed in said surface area of said substrate and acts as a guard ring for said p-n junction of said first diode.

6. A semiconductor device as claimed in claim 5, wherein the same impurity is doped into said first conductive region and said second conductive region in the same fabrication process step, respectively.

* * * * *